United States Patent [19]

Bayer et al.

[11] Patent Number: 4,494,183
[45] Date of Patent: Jan. 15, 1985

[54] PROCESS VARIABLE TRANSMITTER HAVING A NON-INTERACTING OPERATING RANGE ADJUSTMENT

[75] Inventors: Stephen J. Bayer, Fitzwatertown; Arthur M. Olsen, Pennsburg, both of Pa.

[73] Assignee: Honeywell Inc., Minneapolis, Minn.

[21] Appl. No.: 389,633

[22] Filed: Jun. 17, 1982

[51] Int. Cl.³ .......................... G06F 15/20; G01R 35/00
[52] U.S. Cl. .................................... 364/154; 324/115; 364/551; 364/571
[58] Field of Search ............... 364/153, 154, 185, 550, 364/551, 571, 573, 570, 579, 582; 73/1 R; 324/74, 115, 116, 130, 99 R, 99 D

[56] References Cited

U.S. PATENT DOCUMENTS 3,947,665  3/1976  Hundley .......................... 364/185 X
4,189,765  2/1980  Kotalik et al. ................... 364/154 X
4,200,933  4/1980  Nickel et al. .................... 364/573 X
4,263,803  4/1981  Burkhardt ............................. 73/1 R
4,377,851  3/1983  McNamara ...................... 364/558 X
4,408,282  10/1983  Hof .................................. 364/571 X Primary Examiner—Joseph F. Ruggiero
Attorney, Agent, or Firm—Mitchell J. Halista; Trevor B. Joike

[57] ABSTRACT

The operating range for a process variable transmitter used as a pressure transmitter is selectively non-interactively adjusted by successively applying upper and lower range values (URV and LRV) of input pressure to produce an LRV output signal and calculating the URV and the Span which is equal to the difference between the upper and lower range values, i.e., URV-LRV, to produce outputs from the transmitter representing the new upper and lower range values corresponding to the calculated Span.

8 Claims, 1 Drawing Figure

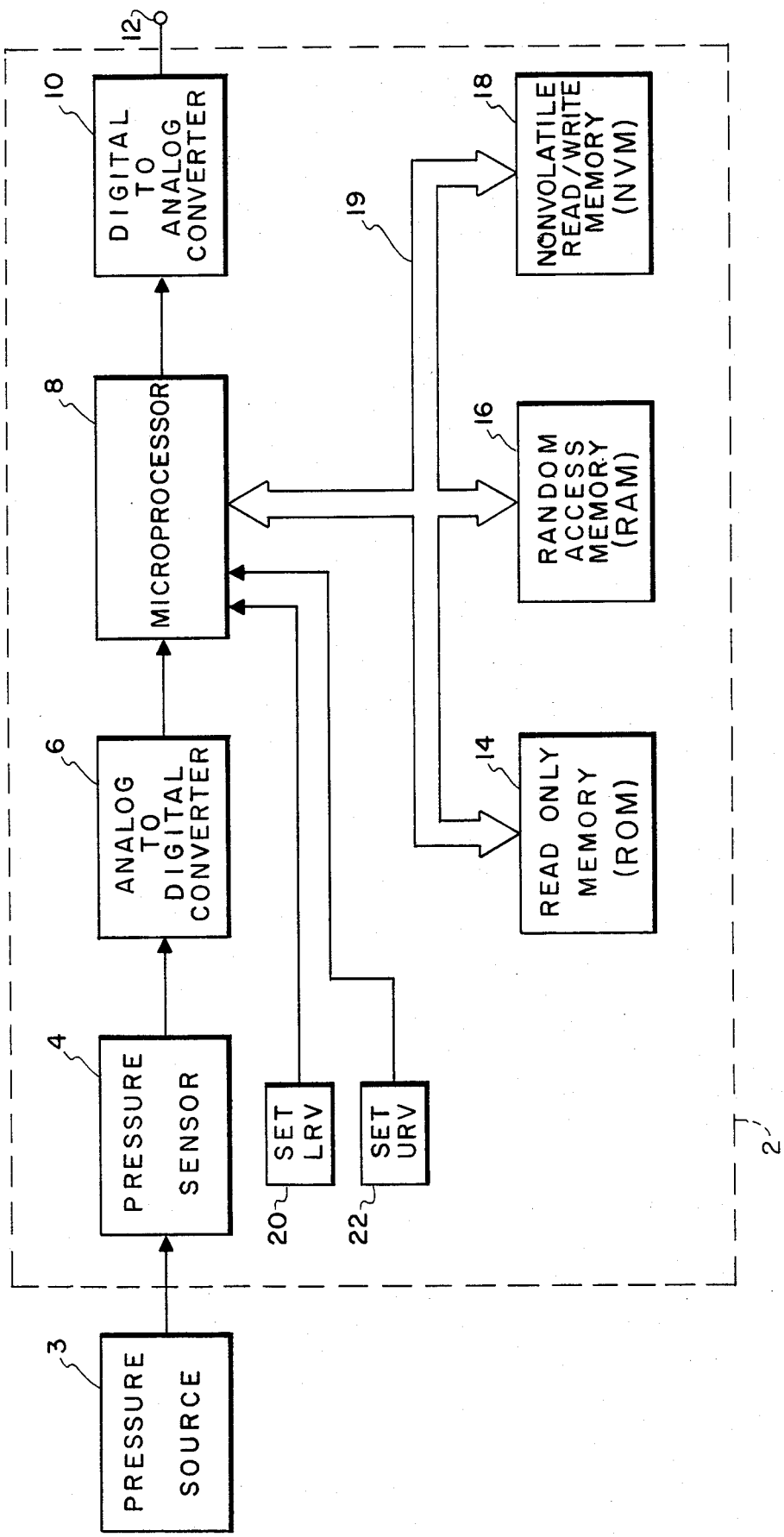

PROCESS VARIABLE TRANSMITTER HAVING A NON-INTERACTING OPERATING RANGE ADJUSTMENT

BACKGROUND OF THE INVENTION

1. Field Of The Invention

The present invention is directed to process variable transmitters. More specifically, the present invention is directed to a process variable transmitter having a selectively adjustable operating range.

2. Description Of The Prior Art

Process variable transmitters, such as pressure transmitters, are factory calibrated during their manufacture to produce a "zero" output of a preselected current value, e.g., 4 ma., at a zero fluid pressure input and a full scale output of a second preselected current value, e.g., 20 ma., at a fluid pressure input other than zero called the upper range limit or URL. It is often desired to change the range of the transmitter to satisfy the measurement and requirements of specific applications by the customer in which the transmitter is to be used. Such an adjustment enables the transmitter to measure an applied input, e.g., a fluid pressure input, that is within its lower range value (LRV) and upper range value (URV) and to produce an output, e.g., between 4 ma. and 20 ma., which is a transmitter output signal proportional to its process variable input between the LRV and URV. The upper and lower range values are adjusted to change the range of the transmitter such that the LRV occurs at some pressure other than a zero fluid input pressure and the URV output occurs at some pressure other than the upper range limit (URL). In conventional devices, the range is changed by manually adjusting circuit potentiometers which set an amplifier gain and zero offset. Specifically, a pressure equal to the desired LRV is applied to the transmitter, and the zero adjust potentiometer is manipulated until the output of the transmitter is measured to be at the lower limit, e.g., 4 ma. A pressure equal to the desired URV is then applied to the transmitter, and the span (gain) adjust potentiometer is manipulated until the output is measured to be at the upper limit, e.g., 20 ma. In this adjustment procedure, the zero and span adjustments interact, i.e., changing one affects the other. For this reason, the aforesaid procedure must be repeated until the amount of adjustment required at either point is insignificant, i.e., does not significantly affect the calibration of the other point. Accordingly, it would be desirable to provide a process variable transmitter which has a selectively variable operating range that is set by a single adjustment operation.

SUMMARY OF THE INVENTION

An object of the present invention is to provide an improved process variable transmitter having a non-interacting operating range adjustment.

In accomplishing this and other objects, there has been provided, in accordance with the present invention a process variable transmitter having a digital computer arranged to produce the transmitter output signals and to calculate the Span or difference between the lower and upper range values (LRV and URV) of the transmitter output signals in response to selectively applied process variable signals representing the desired lower and upper range values of the transmitter input signals. A first computer control means is used to control the computer to set the LRV while a second computer control means is used to control the computer to calculate the Span and to set the URV.

BRIEF DESCRIPTION OF THE DRAWINGS

A better understanding of the present invention may be had when the following detailed description is read in connection with the accompanying drawing, in which, the single FIGURE drawing is a block diagram of a process variable transmitter embodying an example of the present invention.

DESCRIPTION OF THE PREFERRED EMBODIMENT

Detailed Description

Referring to the single FIGURE drawing in more detail, there is shown a process variable transmitter using a specific embodiment of a pressure transmitter 2 which is arranged to measure the fluid pressure from a pressure source 3. The pressure transmitter 2 includes a pressure sensor 4 to which the output fluid pressure from the pressure source 3 is initially applied. The output signal of the pressure sensor 4 is applied to an analog-to-digital (A/D) converter 6. The digital output from the analog-to-digital converter 6 is applied to an input of a microprocessor 8. The microprocessor 8 may be any suitable digital computer for performing an operation on input data using a stored program to produce a representative output signal, such devices being well-known in the art. The output signal of the microprocessor 8 is applied to the input of a digital-to-analog (D/A) converter 10. The output of the digital-to-analog converter 10 is applied to an output terminal 12 for transmission to associated equipment (not shown) as a current signal having a predetermined range, e.g., 4 ma. to 20 ma., representing corresponding values of the fluid pressure from the pressure source 3. The microprocessor 8 includes a read only memory (ROM) 14, a random access memory (RAM) 16 and a nonvolatile read/write memory (NVM) 18. A manually operable Set-LRV signal source 20 is arranged to selectively supply a first control signal to the microprocessor 8 while a manually operable Set-URV source 22 is arranged to selectively apply a second control signal to the microprocessor 8. Stored in the read only memory (ROM) 14 of the microprocessor 18 is the following equation which describes the input to output relationship of the transmitter:

$$\text{Output} = \text{DAC}0 + (((\text{Input} - \text{LRV}) * (\text{URL}/\text{Span})) / \text{URL}) * \text{DACSPAN}$$

where:

DAC0 is the output of the digital-to-analog converter 10 to produce 4 ma.

DACSPAN is the additional input to the DAC which produces an additional output of 16 ma. whereby 4 ma. + 16 ma. produces an output of 20 ma.

URL and LRV are the upper range limit and lower range value, respectively, and

Span = URV − LRV, where URV is the upper range value of the transmitter output.

The values of LRV and Span are stored in the NVM 18. Initially, they are set to values where LRV equals zero, URV equals URL and Span equals URL. The range of the transmitter is changed by applying a pressure from the pressure source 3 equal to the desired LRV to the pressure sensor 4. Concurrently, a first digital control input signal from the Set-LRV source 20 is applied to the microprocessor 8. The current value of the pressure input is equal to the desired LRV. This value replaces the old value in the NVM 18, and the output on output terminal 12 is automatically set to 4 ma. by the microprocessor 8. Next, a pressure equal to the desired URV is applied to the pressure sensor 4 from the pressure source 3. A second digital control input signal from the Set URV source 22 is applied to the microprocessor 8. The current value of the input pressure is equal to the desired URV. A new Span is calculated by the microprocessor 8 using the above equation to replace the old value in the NVM 18, and the output automatically is set to 20 ma. by the microprocessor 8. The transmitter is now re-ranged to operate over the new values of URV and LRV. The "Set-LRV" function affects only the LRV and URV, and the "Set-URV" function affects only the URV and Span. The result is a non-interacting zero and Span adjustment which eliminates the need to progressively fine tune the adjustments. It should be noted that the range of adjustment is not limited by the rangeability of an amplifier. For example, a reverse acting instrument may be produced simply by using an LRV pressure greater than the URV pressure.

Accordingly, it may be seen, that there has been provided, in accordance with the present invention, an improved process variable transmitter having a non-interacting operating range adjustment.

The embodiments of the invention in which an exclusive property or privilege are claimed is defined as follows:

1. A process variable transmitter comprising
a process variable input for connection to a source of a signal representative of a process variable,
a computing means connected to said input for producing a transmitter output representing a desired lower range value of said process variable and a desired upper range value of said process variable,
a set-lower-range value control means for controlling said computing means to produce a lower range value transmitter output at a first value of said process variable and
a set-upper-range value control means for controlling said computing means to produce an upper range value transmitter output at a second value of said process variable by calculating the difference between the upper-range value and the lower-range value.

2. A process variable transmitter as set forth in claim 1 wherein said computing means incudes a digital microprocessor and a digital-to-analog converter to convert an output from said microprocessor to a representative current as said transmitter output.

3. A process variable transmitter as set forth in claim 2 wherein said microprocessor computes an upper range value and a span between said lower range value and said upper range value according to:

$$\text{Output} = DAC\emptyset + (((\text{Input} - LRV)*(URL/\text{Span}))/URL)*DACSPAN$$

where:
 $DAC\emptyset$ is the output of said digital-to-analog converter to produce said first transmitter output,
 URL is the upper range limit of the transmitter output,
 LRV is the lower range value of the transmitter output,
 $\text{Span} = URV - LRV$, where URV is the upper range value of the transmitter output, and
 DACSPAN is the additional input to the DAC which produces said second transmitter output.

4. A process variable transmitter as set forth in claim 1 wherein said first transmitter output is 4 ma. and said second transmitter output is 20 ma.

5. A method of changing the range of a process variable transmitter having a computing means for computing a transmitter output signal including the steps of applying a first predetermined process variable input to said computing means, applying a first control signal to said computing means to produce a first transmitter output signal as a lower range value, applying a second process variable input to said computing means, and applying a second control signal to said computing means to produce a second transmitter output signal as an upper range value by calculating the difference between the lower and upper range values.

6. A method of changing the range as set forth in claim 5 wherein said computing means uses the following equation for calculating the difference:

$$\text{Output} = DAC\emptyset + (((\text{Input} - LRV)*(URL/\text{Span}))/URL)*DACSPAN$$

where:
 $DAC\emptyset$ is the output of said digital-to-analog converter to produce said first transmitter output,
 URL is the upper range limit of the transmitter output,
 LRV is the lower range value of the transmitter output,
 $\text{Span} = URV - LRV$, where URV is the upper range value of the transmitter output, and
 DACSPAN is the additional output to the DAC which produces said second transmitter output signal.

7. A method as set forth in claim 6 wherein URV is greater than LRV.

8. A method as set forth in claim 6 wherein URV is less than LRV.

* * * * *

UNITED STATES PATENT AND TRADEMARK OFFICE
CERTIFICATE OF CORRECTION

PATENT NO. : 4,494,183
DATED : January 15, 1985
INVENTOR(S) : Bayer et al

It is certified that error appears in the above-indentified patent and that said Letters Patent is hereby corrected as shown below:

Column 2, line 50, delete the equation and insert therefor,

-- Output = DAC∅ + (((Input - LRV) *(URL/SPAN))/URL) * DACSPAN --.

Signed and Sealed this

Twenty-third Day of May, 1995

Attest:

BRUCE LEHMAN

Attesting Officer         Commissioner of Patents and Trademarks